(12) United States Patent
Tang et al.

(10) Patent No.: US 6,462,931 B1
(45) Date of Patent: Oct. 8, 2002

(54) HIGH-DIELECTRIC CONSTANT CAPACITOR AND MEMORY

(75) Inventors: Shaoping Tang, Plano; John Mark Anthony, Richardson; Scott Summerfelt, Dallas, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 08/956,407

(22) Filed: Oct. 23, 1997

(51) Int. Cl.[7] ............................ H01G 4/008; H01G 4/06
(52) U.S. Cl. ...................... 361/305; 361/311; 257/295; 257/303; 257/306
(58) Field of Search .................... 361/303–305, 361/311–313, 320–321.5, 322; 257/295–296, 303, 306, 310; 365/145, 149

(56) References Cited

U.S. PATENT DOCUMENTS

| | | | | |
|---|---|---|---|---|
| 5,053,917 A | * | 10/1991 | Miyasaka et al. | 361/321.4 |
| 5,262,920 A | * | 11/1993 | Sakuma et al. | 361/321.5 |
| 5,554,866 A | * | 9/1996 | Nishioka et al. | 257/295 |
| 5,555,486 A | * | 9/1996 | Kingon et al. | 361/305 |
| 5,566,045 A | * | 10/1996 | Summerfelt et al. | 361/321.1 |
| 5,751,540 A | * | 5/1998 | Lee et al. | 361/321.4 |

* cited by examiner

*Primary Examiner*—Anthony Dinkins
(74) *Attorney, Agent, or Firm*—Carlton H. Hoel; W. James Brady; Frederick J. Telecky, Jr.

(57) ABSTRACT

A capacitor (100) with a high dielectric constant oxide dielectric (102) plus Ir- or Ir and Rh bond over the oxygen site in Barium strontium titanate (BST) dielectric to achieve the high Schottky barrier, and very thin layers of Ir or Rh with conductive oxide backing layers (106, 116) provide oxygen depletion deterrence. Rh-containing capacitor plates (104, 114) yielding high Schottky barrier interfaces.

1 Claim, 12 Drawing Sheets

US 6,462,931 B1

HIGH-DIELECTRIC CONSTANT CAPACITOR AND MEMORY

BACKGROUND OF THE INVENTION

The invention relates to electronic devices, and, more particularly, to semiconductor capacitors and methods of fabrication.

Increasing demand for semiconductor memory and competitive pressures require higher density integrated circuit dynamic random access memories (DRAMs) based on one-transistor plus one-capcitor memory cells. But down scaling capacitors with the standard silicon oxide and nitride dielectric presents problems including decreasing quantity of charge stored in a cell. Consequently, alternative dielectrics with dielectric constants greater than those of silicon oxide and nitride are being investigated. Various dielectric materials are available; such as tantalum pentoxide (dielectric constant about 25 versus silicon nitride's dielectric constant of about 7) as described in Ohji et al, $Ta_2O_5$ capacitors' dielectric material for Giga-bit DRAMs, IEEE IEDM Tech. Dig. 5.1.1 (1995); lead zirconate titanate (PZT) which is a ferroelectric and supports nonvolatile charge storage (dielectric constant ~1000) described in Nakamura et al, Preparation of $Pb(Zr,Ti)O_3$ thin films on electrodes including $IrO_2$, 65 Appl.Phys.Lett. 1522 (1994); strontium bismuth tantalate (also a ferroelectric) described in Jiang et al, A New Electrode Technology for High-Density Nonvolatile Ferroelectric ($SrBi_2Ta_2O_9$) Memories, VLSI Tech. Symp. 26 (1996); and barium strontium titanate (dielectric constant about 500) described in Yamamichi et al, An ECR MOCVD $(Ba,Sr)TiO_3$ based stacked capacitor technology with $RuO_2$/Ru/TiN/$TiSi_x$ storage nodes for Gbit-scale DRAMs, IEEE IEDM Tech. Dig. 5.3.1 (1995), Yuuki et al, Novel Stacked Capacitor Technology for 1 Gbit DRAMs with CVD-(Ba, Sr)$TiO_3$ Thin Films on a Thick Storage Node of Ru, IEEE IEDM Tech.Dig. 5.2.1 (1995), Oh et al, A Stack Capacitor Technology with $(Ba,Sr)TiO_3$ Dielectrics and Pt Electrodes for 1 Giga-Bit density DRAM, VLSI Tech. Symp. 24 (1996). Also see Dietz et al, Electrode influence on the charge transport through $SrTiO_3$ thin films, 78 J.Appl.Phys. 6113 (1995) describes electrodes of Pt, Pd, Au, . . . on strontium titanate); US Patent No. 5,003,428 (PZT and barium titanate), U.S. Pat. No. 5,418,388 (BST, $SrTiO_3$, PZT, PLZT, . . . ), and U.S. Pat. No. 5,566,045 (thin Pton BST).

However, each of these dielectric or ferroelectric materials and capacitor structures has problems such as adhesion to commonly used silicon integrated circuit materials (e.g., silicon dioxide), oxygen diffusion, and leakage currents.

SUMMARY OF THE INVENTION

The present invention provides contact materials for barium strontium titanate which give a Schottky barrier height greater than that of comparable (epitaxial or polycrystalline) platinum contacts and also provides oxygen compensating adhesion materials for very thin contacts.

The invention has advantages including low leakage currents and limited dielectric degradation.

BRIEF DESCRIPTION OF THE DRAWINGS

The drawings are schematic for clarity.

DESCRIPTION OF THE PREFERRED EMBODIMENTS

Overview

Platinum (Pt) plates for a capacitor with barium strontium titanate (BST) dielectric provide relatively high Schottky barriers at the interfaces, and this leads to low dc leakage currents. However, Pt does not easily oxidize, and its oxide PtO is nonconductive and decomposes at moderate temperatures. Also, oxygen diffusing through Pt can oxidize underlying barrier materials such as TiN to generate insulating $TiO_2$. Furthermore, BST electrical performance depends upon stoichiometry; and oxygen vacancies at the Pt interface degrade performance. (BST is $(Ba,Sr)TiO_3$ with the ratio of Ba to Sr variable, but for capacitors a ratio in the range of roughly 0.5 to 3 is frequently used.)

Preferred embodiments replace Pt with iridium (Ir) or iridium oxide ($IrO_2$) or a mixture for capacitor plate contacting BST dielectric; this takes advantage of the the fact that $IrO_2$ is conductive and also an oxygen diffusion barrier and even an oxygen source during high temperature processing. The use of Ir and/or $IrO_2$ provides an unexpectedly large Schottky barrier with BST and consequent low dc leakage currents. Further, rhodium (Rh) also provides an unexpectedly high Schottky barrier with BST, and preferred embodiments include a Rh and/or $RhO_2$ capacitor plate contacting BST dielectric.

Preferred embodiments also use very thin Ir or Rh layers contacting BST dielectric together with a layer of $RuO_2$ (or other conductive oxide such as $IrO_2$, $RhO_2$, $OsO_4$, etc.) as a backing layer for the very thin Ir or Rh: the conductive oxide will be a barrier for oxygen diffusion from the BST (or other oxide dielectric) and even acts as a source of oxygen to diffuse through the very thin Ir or Rh back into the dielectric. Preferably, the Ir or Rh will have minimal thickness to insure surface coverage, although with $IrO_2$ or $RhO_2$ backing layers the BST interface at holes in a minimal Ir or Rh thickness contact layer should still have a high Schottky barrier.

Figure 1A:
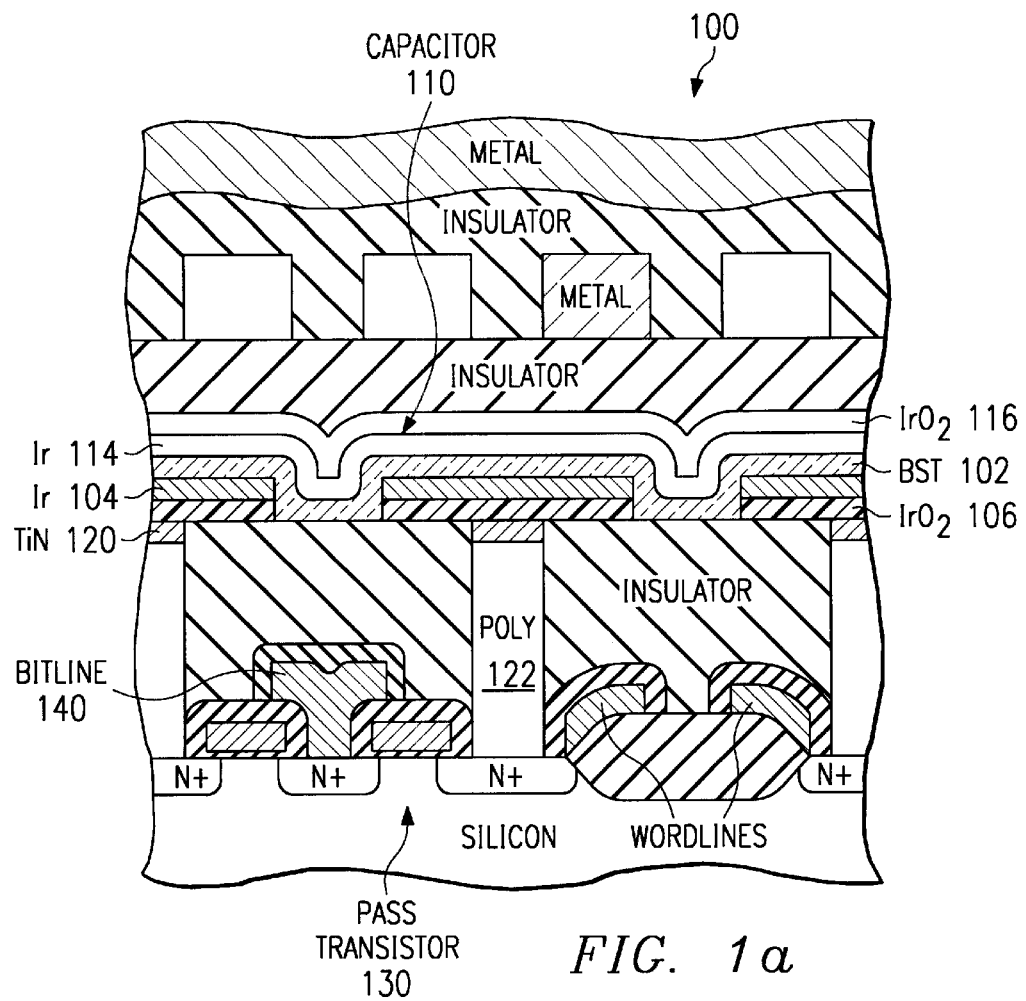
FIGS. 1a–c show a first preferred embodiment DRAM cell and circuitry.

FIG. 1a shows preferred embodiment DRAM cell 100 in cross sectional elevation view incorporating preferred embodiment capacitor 110. In particular, BST dielectric 102 has contact electrodes 104, 114 made of Ir plus electrode backing layers 106, 116 made of $IrO_2$. TiN diffusion barrier 120 and polysilicon plug 122 connect capacitor 110 to the source of pass transistor 130; bitline 140 connects to the drain of pass transistor 130.

Figure 1B:
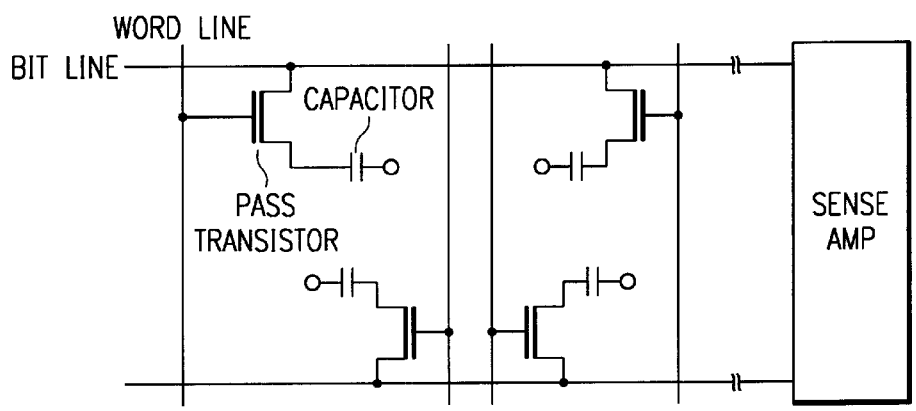
Figure 1C:
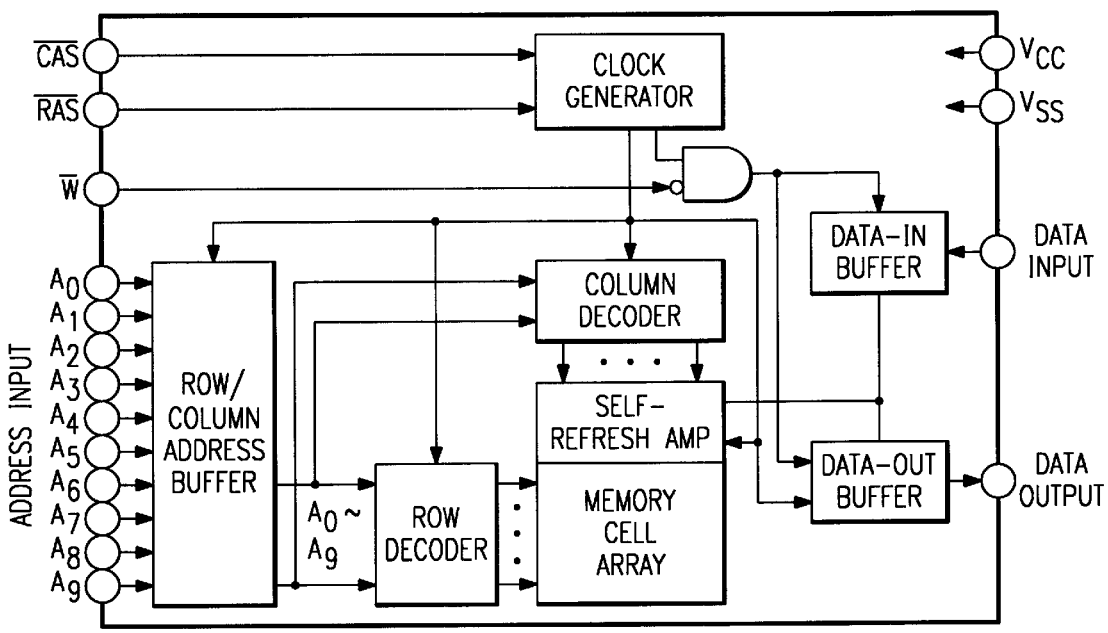

FIGS. 1b–c schematically show one-transistor/one-capacitor memory cells in an array and overall functional blocks of a DRAM.

First Principles Analysis

A typical ferroelectric or high dielectric constant memory cell capacitor fabrication would deposit the dielectric material thin film on a metal bottom capacitor plate and then deposit a metal top capacitor plate on the dielectric. The two metal/dielectric interface properties significantly -affect the electrical performance of the capacitor. Thus the selection of contact metal has an important impact on the optimal performance of the metal/dielectric interfaces.

To understand the effects of metal/dielectric interfaces on the performance of the capacitor and make a successful device, the basic structural and electronic properties of the interfaces have to be investigated at the microscopic level. Recognizing that microscopic information about the interface is very difficult to obtain from experiments, first principles electronic structure calculations have proved to be a powerful tool to compensate the deficiency. The inventors have performed first-principles study of the transition-metal/ (001)-$BaTiO_3$ interfaces where the transition metals studied are the 5d metals tantalum (Ta), tungesten (W), iridium (Ir), and platinum (Pt), and the 4d metals rhodium (Rh) and palladium (Pd). Ruthenium (Ru), rhenium (Re), and osmium (Os) have hexagonal lattices rather than the face-centered cubic of Pd, Rh, Ir, and Pt and thus have been omitted from the analysis. No ferroelectric displacement of the $BaTiO_3$ is considered in the calculations. Stable structures are calculated by total energy relaxation. Interface electronic structures, such as charge density and charge transfer, density of states and band structures, are determined in order to understand the bonding mechanism and the interaction between the metals and the $BaTiO_3$ surface. Lastly, the Schottky barriers of the interfaces are calculated from the position of the Fermi level in the band gap of the $BaTiO_3$; this provides estimation of leakage current limitations and the ultimate choice of metal for a capacitor with BST dielectric. Of course, real capacitors may have nonepitaxial metal/BST interfaces and contamination which will affect Schottky barrier height, but the relative Schottky barrier height still provides a guide to selection of the contact metal for BST.

$BaTiO_3$ has a face-centered cubic perovskite crystal structure with Ti at the cell center, O at the face centers, and Ba at each corner. The calculations set up two slab models to study the transition-metal/(001)-$BaTiO_3$ interfaces which are displayed in FIGS. 2a–b. In the onc-cell model the $BaTiO_3$ slab consists of one face-centered cubic cell in the vertical direction (z-axis), with a metal monolayer adsorbed on the top and bottom slab surfaces. In the three-cell model, the $BaTiO_3$ slab consists of three face centered cubic cells and the metal monolyaers at the top and the bottom. Comparing the results of these two models provides a check of the effect of slab size on the calculated results. The lattice constant of $BaTiO_3$ is set to the bulk value of 0.400 nm; and the mismatch with the lattice constants of the tested metals is as follows: Ta 21%, W 26%, Ir 4%, Pt 2%, Rh 5%, and Pd 3%.

The electronic structure is treated in the framework of density functional theory in the local density functional approximation (LDA) and with the Hedin-Lundqvist exchange correlation potential. The highly precise full potential linearized augmented plane wave (FLAPW) method is employed to solve the Kohn-Sham equations self-consistently. In the FLAPW method, no shape approximations are made for the charge density, potential and matrix elements. The core electronis are described by the atomic wave functions which are solved fully relativistically in isolated atoms. The valence electrons are treated semi-relativistically, that is, the spin-orbit coupling is neglected.

Two energy windows, valence panel and semi-core panel, are used for the calculations and extended core levels such as Ti 3p are treated as semi-core states, meaning that they are described by Bloch wavefunctions, not by atomic wavefunctions. Being in two different energy windows, the valence and semi-core states are solved independently by ignoring their interactions. The set up of valence and semi-core states is as follows: semi-core: O 2s, Ti 3s3p, Ba 5s, and metal 5p or 4p; and valence: O 2p, Ti 4s3d, Ba 5p6s, and metal 6s5d or 5s4d. Note that the O 2s and the metal 5p or 4p are put in the semi-core panel because the replusive froce from their overlap plays an essential role in the interaction between O and metal. To get an equilibrium metal-oxygen distance, one has to orthogonalize these two states. The Ba 5p states are treated in the valence panel because they are close to the valence bands (at about 5 eV below the bottom of the valence band).

The muffin-tin (MT) radii of O, Ti, Ba, and the metal are set at 1.2, 2.1, 2.4, and 2.4 atomic units, respectively. The calculations use about 700 and 1700 plane waves to expand the electron wave functions in the interstitial region for the one-cell and three-cell models, respectively. The charge density and potential inside the MT spheres are expanded in spherical harmionics up to l=8, and 15 special k points in the ⅛th irreducible 2D Brillouin Zone (BZ) are used to carry out the integrations.

Figure 2A:
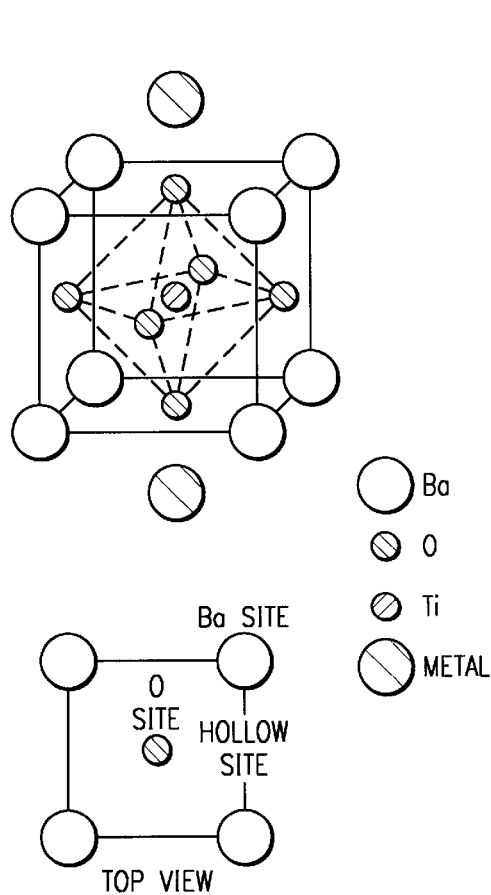
FIGS. 2a–7 illustrate calculation results.
Figure 2B:
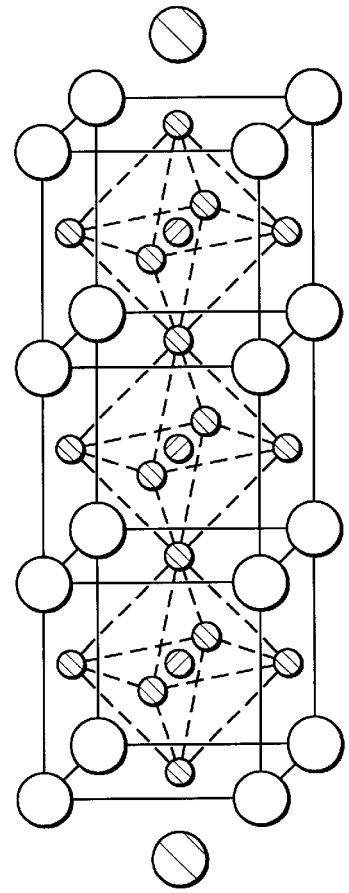
Figure 3:
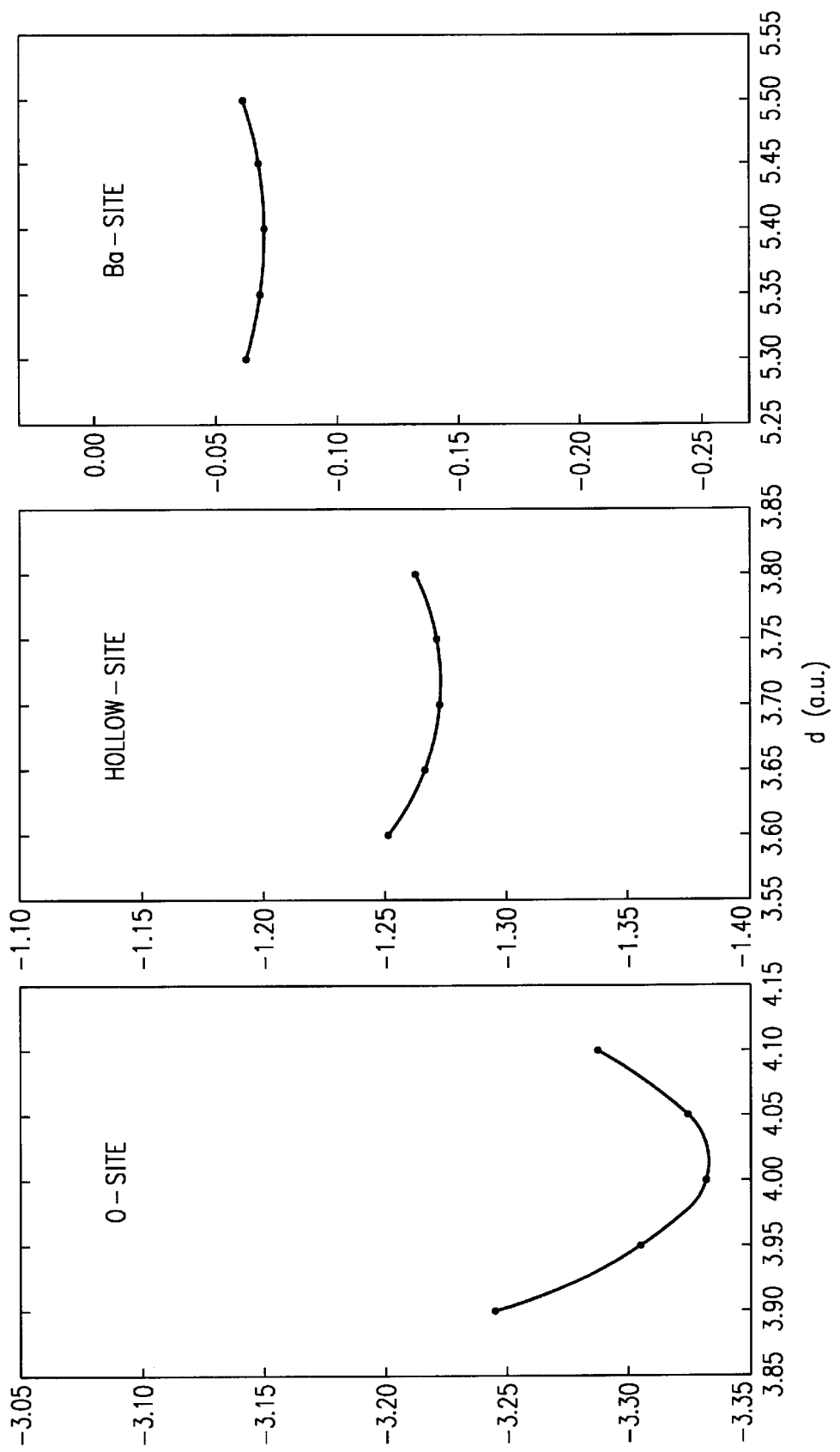

The equilibrium interfacial distances between metals and the (001) $BaTiO_3$ surface were determined by total energy relaxation of the metal layer along the zirection. Three symmetric adsorption sites of the $BaTiO_3$ surface, namely above the O site, above the Ba site, and the hollow site, were investigated in the Pt/$BaTiO_3$ one-cell system to find out the most stable position for metal atoms. (FIG. 2a shows the metal atom adsorbed above the O site.) FIGS. 3a–3c. shows the total energy relaxation for these three sites and one can see that the total energy of the O site is about 2.06 eV and 3.26 eV per unit cell lower than those of the hollow site and the Ba site, respectively. Therefore, the preferred adsorption site is above the O site. The Pt-O bond length for the O site, which is 0.212 nm (4.01 atomic units), is found to be smaller than the Pt—Ba bond length for the Ba site, which is 0.286 nm (5.40 atomic units). For the hollow site, the separation between the Pt layer and the $BaTiO_3$ surface is 0.197 nm (3.7 atomic unites) and the corresponding Pt—O (or Pt—Ba) interatom distance is 0.283 nm (5.34 atomiic units). The large difference of binding energy and bond strength among these three adsorption sites may be due to the electrostatic interaction between Pt and the O or Ba ions since O and Ba carry negative and positive charge, respectively, in $BaTiO_3$ and the the Pt nucleous is positively charged.

Due to the similarity among the 5d and 4d metals, likely the preferred adsorption site for Ta, W, Ir, Rh, and Pd is the same as for Pt, that is, above the O site. The relaxation of the other metals above the O site on the $BaTiO_3$ surface were calculated with both one-cell and three-cell geometries; the calculated metal-oxygen distances are as follows for one-cell: Ta 0.204 mm, W 0.207 mm, Ir 0.213 nm, and Pt 0.212 nm; and for three-cell: Ta 0.205 nm, W 0.207 mm, Ir 0.211 mm, Pt 0.211 nm, Rh 0.213 nm, and Pd 0.216 mm. The binding energies between metals and $BaTiO_3$ are for one-cell: Ta 5.58 eV, W 5.35 eV, Ir 4.97, and Pt 4.23 eV; and for three-cell: Ta 5.45 eV, W 4.96 eV, Ir 4.73, and Pt 3.90 eV. Thus the metal-oxygen distance increases from Ta to Pt because the smaller the atomic number, the weaker the Coulomb replusive force between the metal core and O. Meanwhile, the interaction between Ta and O is stronger than between Pt and O because of the open shell atomic structure in Ta. Thus, the binding energy decreases from Ta to Pt. Since the results of the metal-oxygen bond length from one-cell and three-cell models are in excellent agreement with each other, this implies that the interaction between metals and $BaTiO_3$ is limited to within less than two layers of the interface region.

Figure 4:
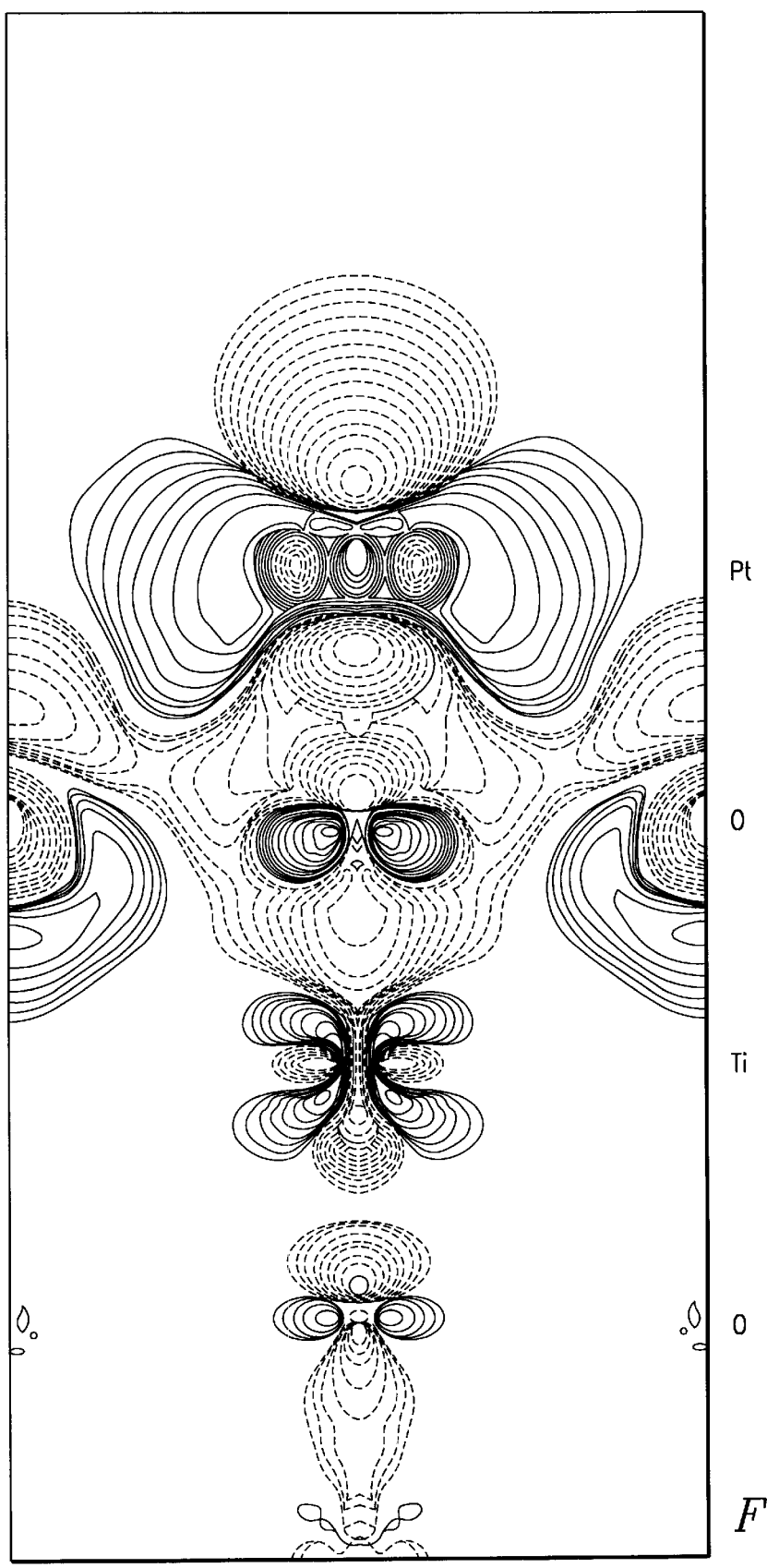

Charge transfer contours in the Pt/$BaTiO_3$ interface, obtained by substracting the superposed charge density of the $BaTiO_3$ clean surface and the Pt monolayer from the Pt/$BaTiO_3$ charge density (all calculated self-consistently), are plotted along the (110) direction in FIG. 4. It is seen that the change of the charge density is localleed in the interface area and that it decays rapidly into the $BaTiO_3$ bulk. FIG. 4 demonstrates that the strong Coulomb repulsive potential of the O atom in the interface drives electrons away from the region between Pt and O. To calculate the charge transfer, substract the charge population of each atom in the metal monolayer or the clean BaTiO$_3$ surface from that in the interface and the results in the three-cell slab show that the charge in the metal atoms all increase by about 0.15 electron and the transfer to Ba, Ti and O atoms is less than 0.06 electron. Such a small charge transfer indicates that there is no strong ionic bonding between metals and BaTiO$_3$. More charge transfer in BaTiO$_3$ is found for Ta and W than for Ir and Pt.

FIG. 4 also demonstrates Pt electrons are moved from d(z$^2$) states into d(x$^2$–y$^2$) states by the Coulomb repulsion of the O 2p electrons. With less d(z$^2$) character, the Pt layer has less electron spill out into the vacuum so the dipole moment between Pt and vacuum is reduced. Consequently, the Coulomb barrier from Pt to vacuum is lowered and the Pt work function decreases from 6.47 eV in the free monolayer to 4.71 eV in the overlayer. The calculated work functions of other meals in the both monolayer (all with the same lattice constant as BaTiO$_3$) and interface, as well as the work function of the BaTiO$_3$ clean surface are:

|            | Ta   | W    | Ir   | Pt   | BaTiO$_3$ |
|------------|------|------|------|------|-----------|
| monolayer  | 4.68 | 5.32 | 6.29 | 6.47 | —         |
| one-cell   | 3.55 | 4.01 | 4.82 | 4.87 | 3.42      |
| three-cell | 3.55 | 4.03 | 4.88 | 4.71 | 3.22      | where the work functions are in eV. This shows that the 5d metal work function increases with atomic number from Ta to Pt in both the free monolayer and the interface cases. For all the other metals, work functions for the overlayers are lower than for the free monolayers, but higher than for the BaTiO$_3$.

Figure 5A:
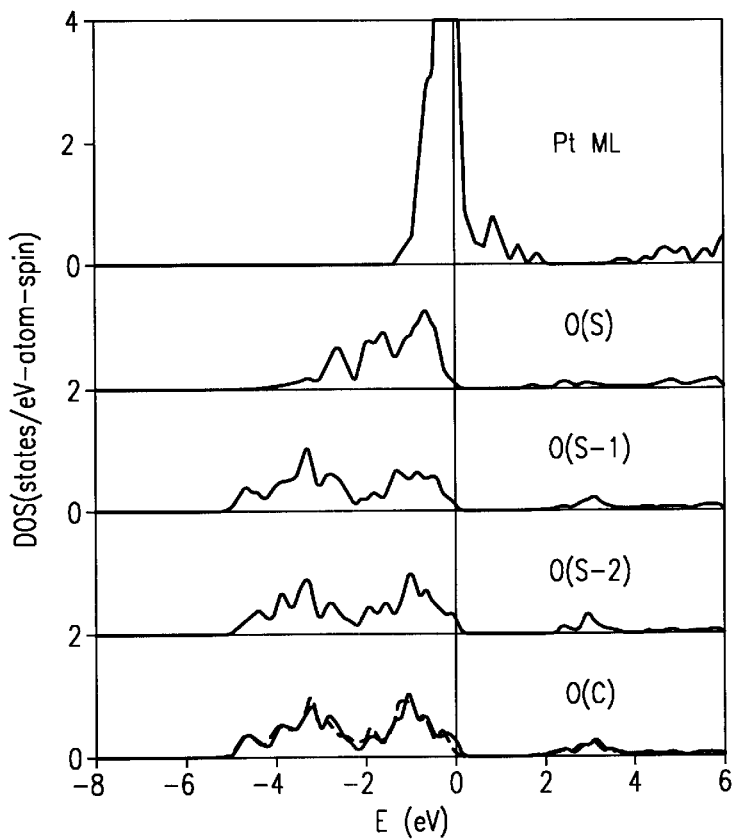
Figure 5B:
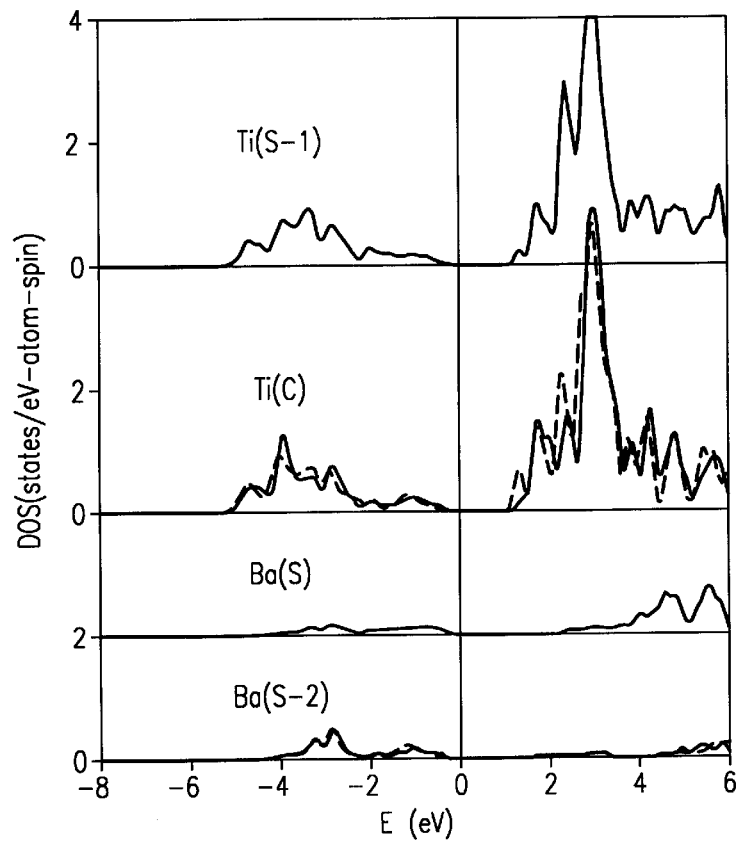

The partial density of states (DOS) projected on each atom in the three-cell BaTiO$_3$ clean surface and the free Pt monolayer are plotted in FIGS. 5a–b. The BaTiO$_3$ valence bands lie from the Fermi energy (E$_F$) to about 5 eV below (the tails of the valence bands above E$_F$ come from the broadening of the plot). The Ti DOS shows that the valence states have significant weight on the Ti ions and so they are hyubridized O 2p–Ti 3d states instead of pure O 2p states. Ba is essentially fullly ionized with a very low DOS in the valence region. The lower part of the conduction bands are mainly the Ti 3d states. Because of the reduced number of neighboring atoms at the surface, the surface O 2p bands are narrower and sharper than those of the other O layers. For comparison, calculations for bulk BaTiO$_3$ lead to the DOS of the O, Ti, and Ba in the bulk are plotted as dashed lines in FIGS. 5a–b together with the O(C), Ti(C), and Ba(S-2) densities of states, respectively. It is clear that the DOS of the S-2 (two below the surface) layer and the C (central) layer recover bulk-like features while the S-1 and surface layers show different structures compared with the bulk states. The calculated gap of the three-cell BaTiO$_3$ clean slab is 1.22 eV. This number is quite close to the calculated bulk value, which is 1.16 eV. For the one-cell BaTiO$_3$ slab, the calculated gap is 1.39 eV. With ionic bonding in BaTiO$_3$, electrons are localized around nuclei and the size effect on the gap is expected to be insignificant in the thicker slab. As usual in LDA calculations, the computed gap value is smaller than the experimental value, which is about 3.13 eV.

Figure 6A:
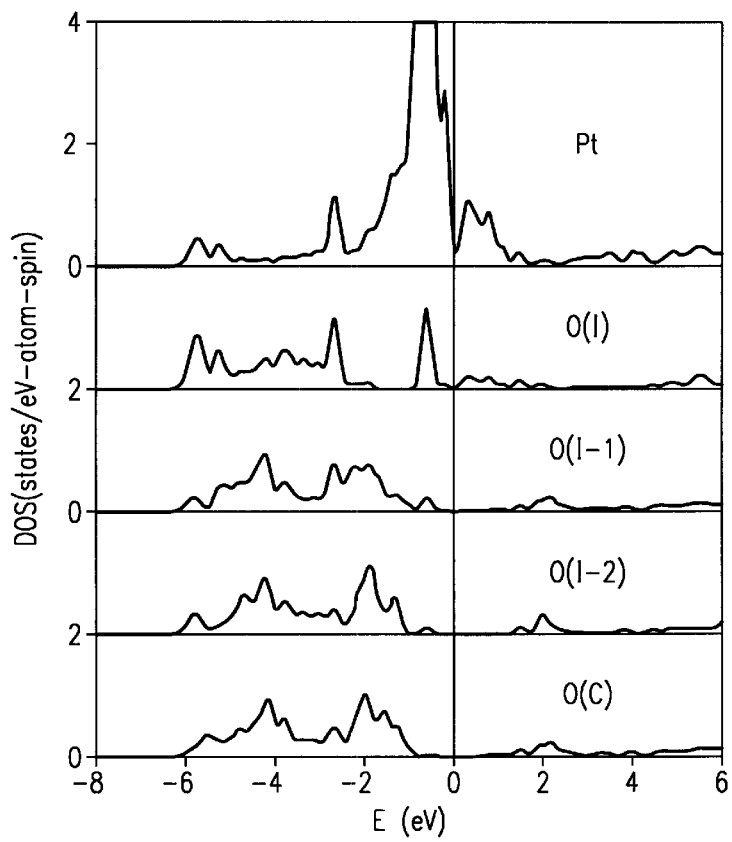
Figure 6B:
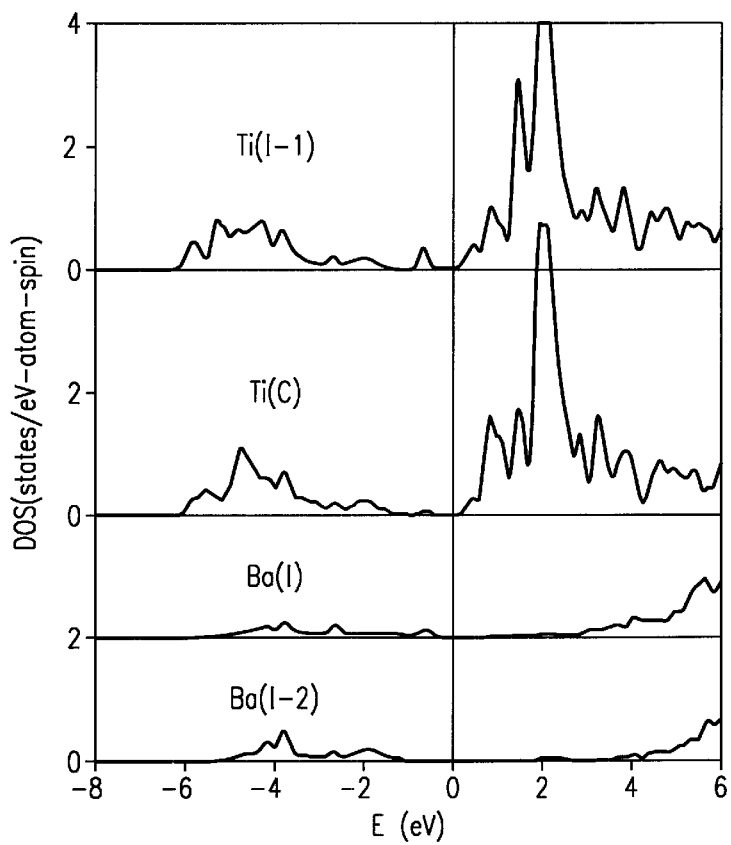

The partial DOS of three-cell Pt/BaTiO$_3$ with Pt above the O site is plotted in FIGS. 6a–b. Significant hybridization features are found between the Pt 5d and O 2p states. Compared to the free Pt monolayer, new peaks are developed in the Pt overlayer from about 2.0 eV to 5.8 eV below E$_F$ with an almost identical structure in the interface O(I) layer. The main Pt 5d peak is broadened by the interaction with O and the peak height drops from about 19 states/eV-atom-spin in the free monolayer to about 14 states/eV-atom-spin in the overlayer. The density of states at E$_F$ for Pt (or other metals) drops dramatically from about 15 states/eV-atom-spin to about 0.4 states/eV-atom-spin. Int he O(I) DOS, a sharp peak is formed by the tail of Pt 5d states right in the gap region at about 0.6 eV below E$_F$ and it penetrates to the O(I-2) and Ti(I-2) atoms. Two peaks near the bottom of the valence bands at about 5.7 eV and 5.2 eV below E$_F$ are strongly enhanced in O(I), whereas they actually vanish in the clean surface case. The DOS of atoms in the two central layers remain basically unchanged. Similar hybridization features are also found in the interfaces between BaTiO$_3$ and other metals.

The Schottky barrier is formed in metal-semiconductor or metal-insulator interfaces between the metal Fermi level and the bottom of the semiconductor or insulator conduction bands. The barrier height depends upon the position of the metal Fermi energy in the interface. It can be shown that in any metal-insulator interface, the metal E$_F$ has to stay within the insulator gap region to balance charge populations on both sides. Otherwise electrons will transfer from bulk insulator valence states to metal states (if E$_F$ lies below the gap) or from metal to bulk insulator conduction states (if E$_F$ lies above the gap). Because the bulk states are all extended states, this transfer must happen everywhere in the volume of the insulator. Therefore, metal and insulator will be unphysically polarized even far away from the interface. When E$_F$ lies in the gap the charge transfer is confined within a few atomic layers in the interface and the electron occupation in the bulk is unaffected because for energies in the band gap the metal states decay exponentially into the insulator side due to a lack of matching insulator bulk states at the same energy. Thus, as a result of charge balance, the only place the metal Fermi level can stay in metal-insulator interfaces is inside the gap.

For the metal/BaTiO$_3$ interface, from the O(C) density of states in FIG. 6a, one can see that the Pt Fermi energy lies in the gap of BaTiO$_3$ at about 1.0 eV above the bottom of the gap. Notice that as shown previously, E$_F$ of the free Pt monolayer is located at 6.47 eV below the vacuum potential and the top of the valence bands in the clean BaTiO$_3$ three-cell slab is located at 3.2 eV below vacuum. So the Pt E$_F$ is 3.25 eV below the bottom of the gap when Pt and BaTiO$_3$ are separated. After Pt is deposited on the BaTiO$_3$ surface, electrons are transferred from BaTiO$_3$ to Pt by the interfacial hybridization. A dipole layer is then formed between Pt and BaTiO$_3$ in the interface to raise the Pt Fermi level relative to the BaTiO$_3$ bands until it moves into the gap. Actually, for all the other 5d metals, E$_F$ is shifted from below the gap to inside the gap by the dipole layer in the interfaces. The tail of the metal 5d states in BaTiO$_3$, recognized as metal-induced gap states (MIGS), appears clearly in the O(I) layer.

The effect of the metal-induced gap states was first pointed out by Heine and discussed by a number of authors. In Heine's theory, the metal-induced gap states transfer metal electrons into the insulator in the metal-insulator system. The shift of E$_F$ is determined by the mismatch of work functions between the metal and the insulator, the dielectric constant in the interface, the density of states and the penetration length of the MIGS in the insulator. For a more general case, the $E_F$ shift is controlled by both the MIGS and the tail of the insulator valence states. As shown in FIG. 6a, the BaTiO$_3$ valence states below the Pt 5d bands also penetrate into the Pt side by the same mechanism as MIGS and cause the charge transfer from BaTiO$_3$ to Pt. Finally, the position of $E_F$ is determined by the balance between the two processes.

Figure 7:
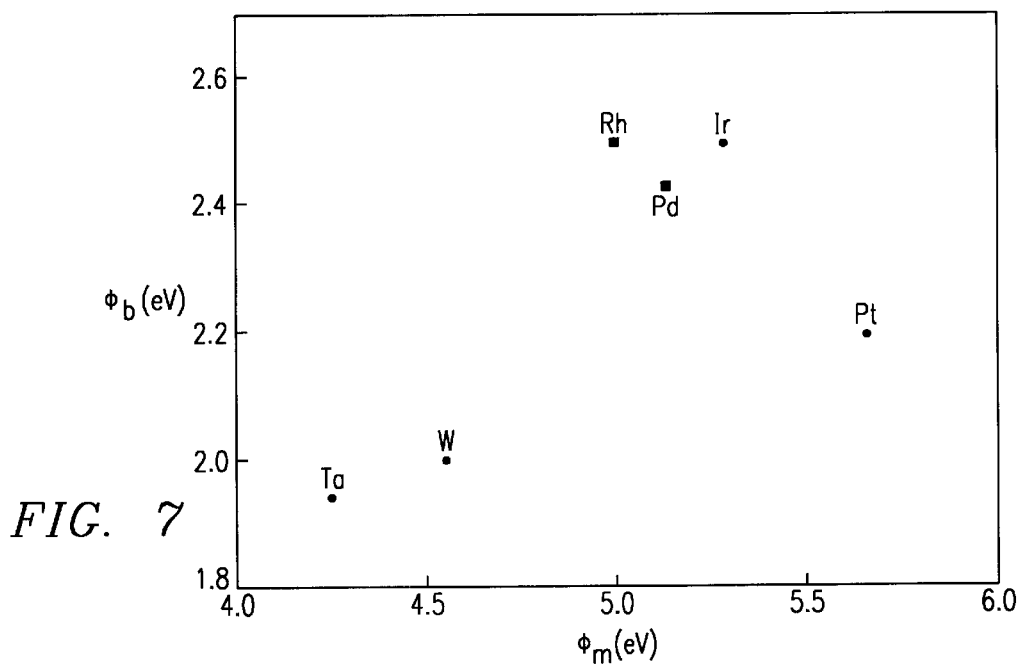

The first-principles calculations of the Schottky barrier at the interfaces of aluminum with semiconductors Si, Ge, GaAs, ZnSe and ZnS were carried out by Cohen et al. In a similar approach to theirs, the present calculations extrapolate the position of $E_F$ in the gap from the partial density of states of the central layer in the metal/BaTiO$_3$ three-cell slab where the band gap is well defined. The calculated energy difference between the Fermi energy and the top of the BaTiO$_3$ valence band ($E_F$–$E_V$) are: Ta 1.19 eV, W 1.13 eV, Ir 0.64 eV, Pt 0.94 eV, Rh 0.64 eV, and Pd 0.71 eV. The Schottky barrier heights can be obtained by subtracting $E_F$–$E_V$ from the experimental gap value of 3.13 eV; thus the Schottky barriers are: Ta 1.94 eV, W 2.00 eV, Ir 2.49 eV, Pt 2.19 eV, Rh 2.49 eV, and Pd 2.42 eV. The position of 5d metal $E_F$ in the gap shows a descending trend from Ta to Pt except for Ir, which has a lower $E_F$ than Pt. Note that $E_F$ changes significantly among the metals. No Fermi energy pinning is observed in these transition metal/BaTiO$_3$ interfaces. This is in agreement with the observation of Louie et al that the Schottky barrier is much less dependent upon the metal for the covalent materials than for the ionic ones. It is believed that the barrier height is a monotonic function of the free metal work function and, using the Schottky-Mott limit, the barrier height is simply a linear function of the work function. FIG. 7 plots the barrier height as a function of the free metal monolayer work function. Clearly, Ir and Rh unexpectedly lead to a higher Schottky barrier. Because of the effect of the Schottky barrier on the DRAM capacitor performance, such as leakage current and breakdown field, Ir or Rh at the interface will provide the best performance. Indeed, in the Schottky emission mechanism, thermal activation leads to a leakage current (J) determined by Schottky barrier height ($\phi_B$), applied electric field (E), and temperature (T) as:

$$J = AT^2 \exp[(-\phi_B + c\sqrt{E})/kT]$$

where A is the effective Richardson constant and c a constant depending upon the reciprocal of the square root of the dielectric constant. This shows the exponential dependence of the leakage current on Schottky barrier height: a ten fold increase in J at room temperature for a 0.06 eV decrease in the Schottky barrier height. And the same results should apply to the dielectric being (Ba,Sr)TiO$_3$ because the substitution of Sr for some of the Ba should not change the interface metal atoms being over the O sites.

Fabrication

Figure 8A:
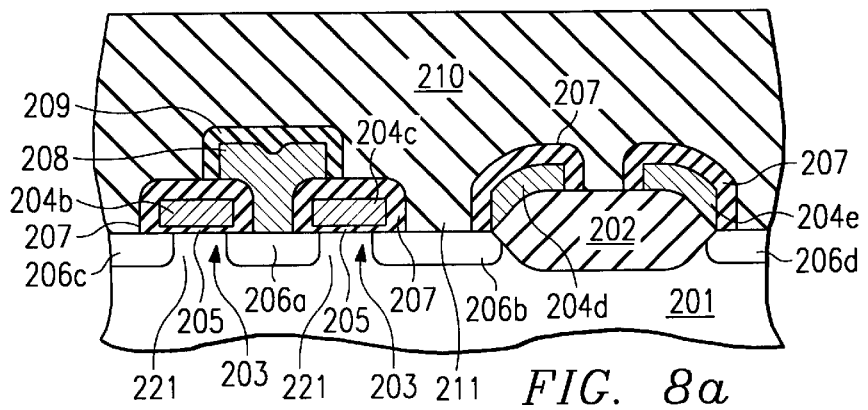
FIGS. 8a–i show a fabrication method.

The first preferred embodiment of FIG. 1a may be fabricated as illustrated in FIGS. 8a–i as follows:

(1) Form local isolation (LOCOS or trench) in a silicon wafer; see field oxide 202 on silicon substrate 201 in FIG. 8a.

(2) Form field effect pass transistors and wordlines; typically these would be doped polysilicon, silicided polysilicon, or metal. FIG. 8a shows two pass transistors 203 with gates 204b–c, gate oxides 205, common drain 206a, sources 206b–c, channel regions 221, gate insulators 207, and wordlines 204d–e with insulators 207.

(3) Form bitlines which connect to the drains of the pass transistors; the bitlines would be on an insulator layer over the wordlines. FIG. 8a shows bitline connection 208 with insulator 209.

(4) Form a (planarized) insulator over the bitlines and wordlines and transistors; silicon dioxide or some low dielectric constant material (or combination or stack) may be used. See FIG. 8a illustrating planarized insulator 210.

Figure 8B:
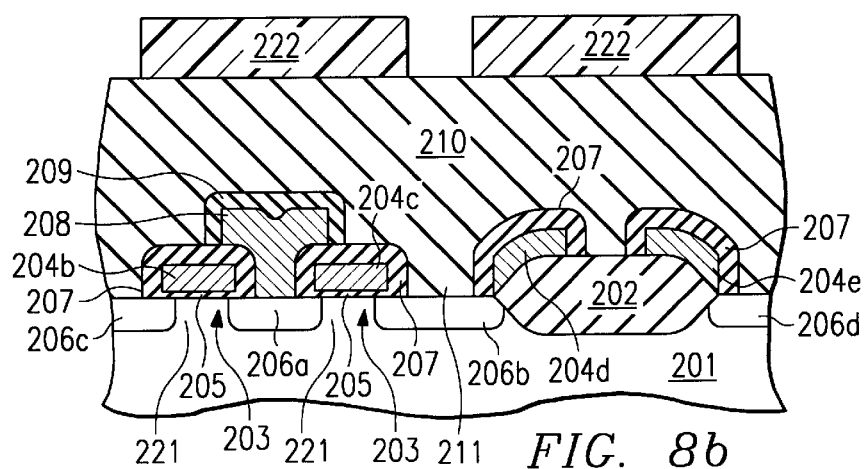
Figure 8C:
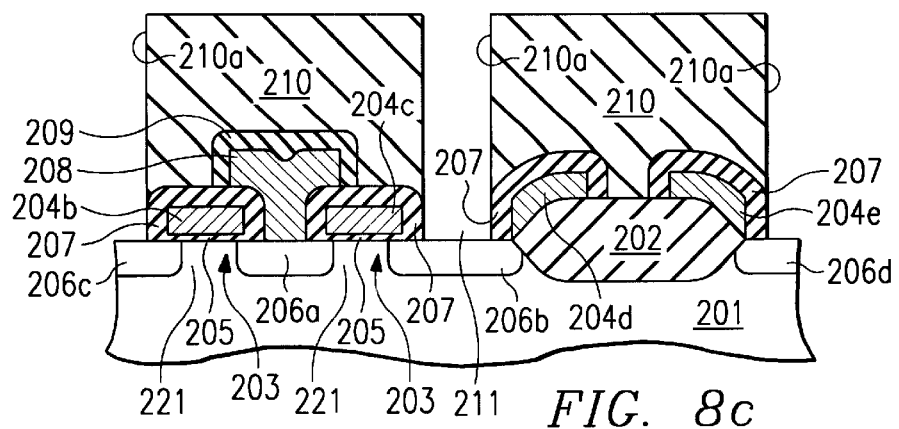

(5) Form vias through the insulator(s) to the sources of the transistors; see FIGS. 8b–c showing photoresist 222 and etched via 211 with sidewalls 210a.

Figure 8D:
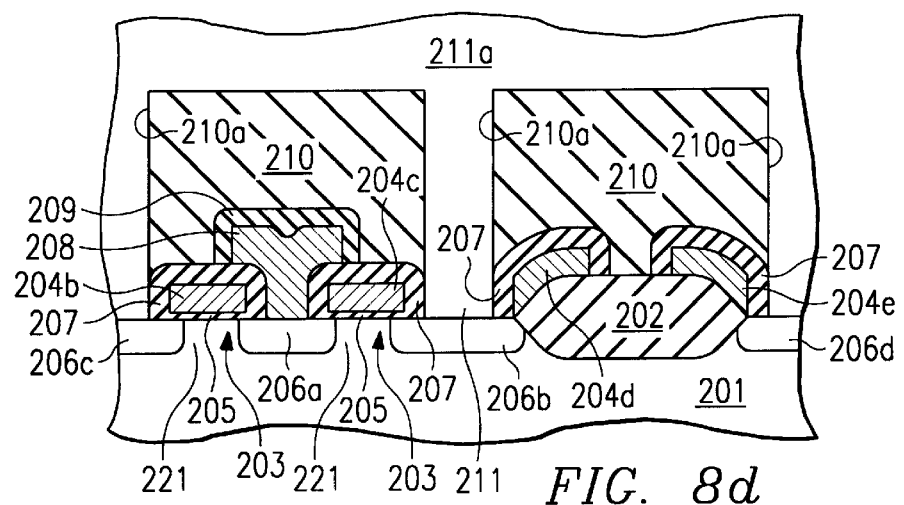
Figure 8E:
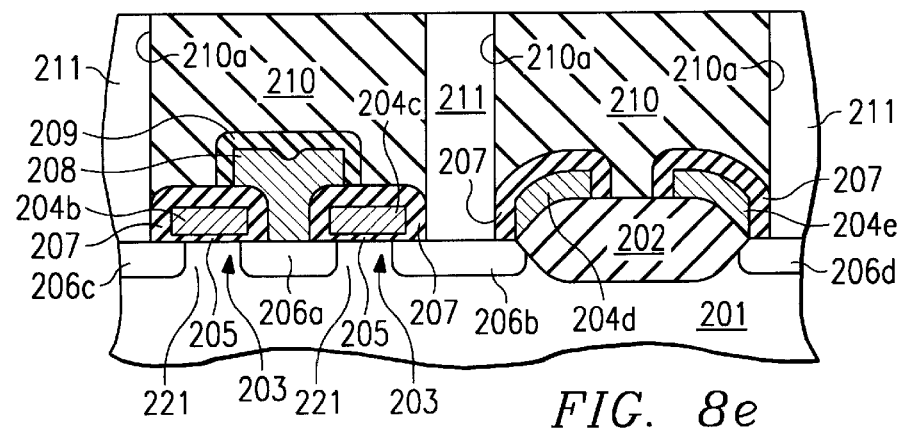

(6) Fill the vias with a conductor such as doped polysilicon or metal; see FIG. 8d will deposited conductor 211a and FIG. 8e with the conductor etched back to only fill vias 211. A conductive silicon diffusion barrier may be used on top of polysilicon-filled vias as TiN in FIG. 1a to avoid Ir-polysilicon interactions; such a diffusion barrier may also be an adhesion layer as noted in following step. IrO$_2$ could be an adhesion layer plus oxygen diffusion barrier as in FIG. 1a.

Figure 8F:
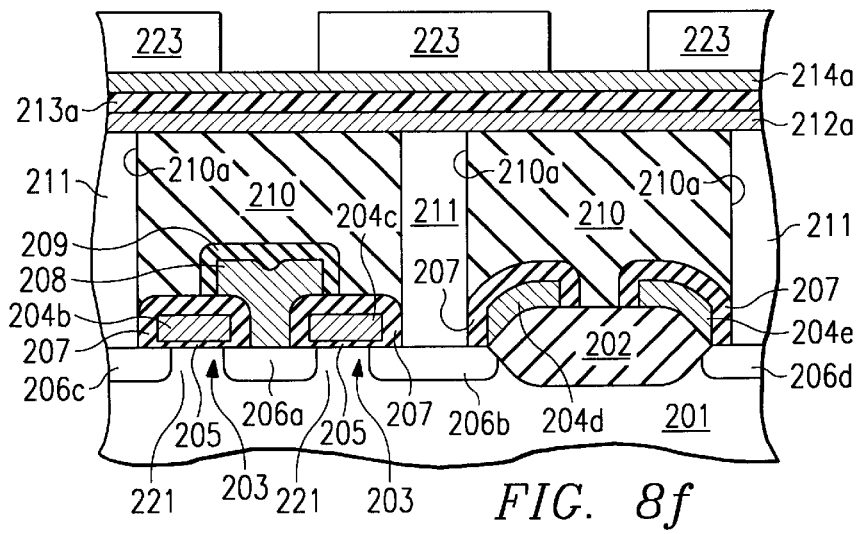
Figure 8G:
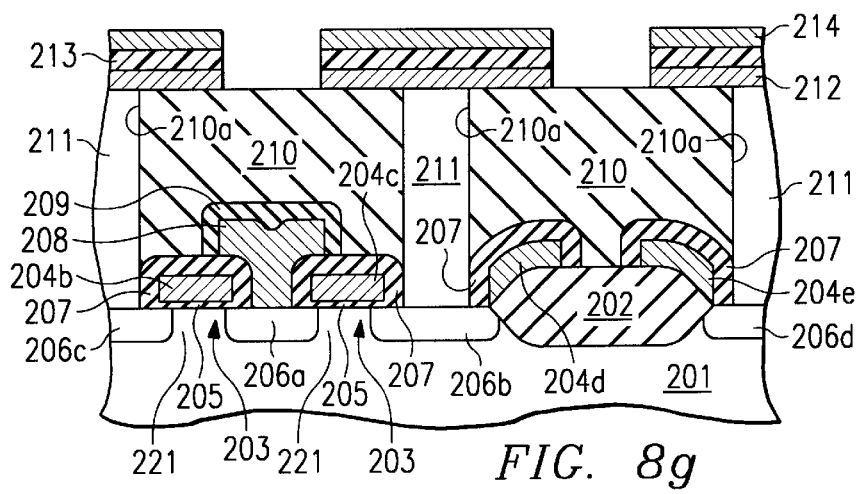

(7) Deposit an Ir layer (50–100 nm thick) on the insulator and filled vias by sputtering or MOCVD; an adhesion layer (e.g., IrO$_2$) may be applied prior to the Ir deposition if Ir does not stick to the insulator. In this case the Ir may be very thin (e.g., 5–10 nm) and the IrO$_2$ provide an oxygen diffusion barrier plus high temperature oxygen source. FIG. 8f shows blanket TiN 212a, IrO$_2$ 213a, and Ir 214a with patterned photoresist 223 to define the location of the capacitors; in this case the TiN acts as both adhesion layer and silicon diffusion barrier, the IrO$_2$ acts as the oxygen diffusion barrier, and the (very thin) Ir provides the BST interface contact.

(8) Pattern the Ir (plus IrO$_2$ and TiN) layer to form bottom capacitor plates; each plate connects to a polysilicon-filled via, and the patterning may use a Cl$_2$/O$_2$ plasma etch. See FIG. 8g.

(9) Deposit BST layer 215 on the Ir bottom plates 214 and intervening exposed insulator 210; this deposition may be by sputtering or MOCVD and followed by annealing in an oxygen or nitrogen or argon atmosphere at temperatures roughly in the range of 600–800° C. The annealing may oxidize some of the Ir, but IrO$_2$ is conductive and the Ir monolayer at the interface remains with the Ir still at the O sites of the BST. An underlying IrO$_2$ layer acts as an oxygen diffusion barrier and even as an oxygen source for the BST. The silicon barrier prevents diffusion upwards from the vias.

Figure 8H:
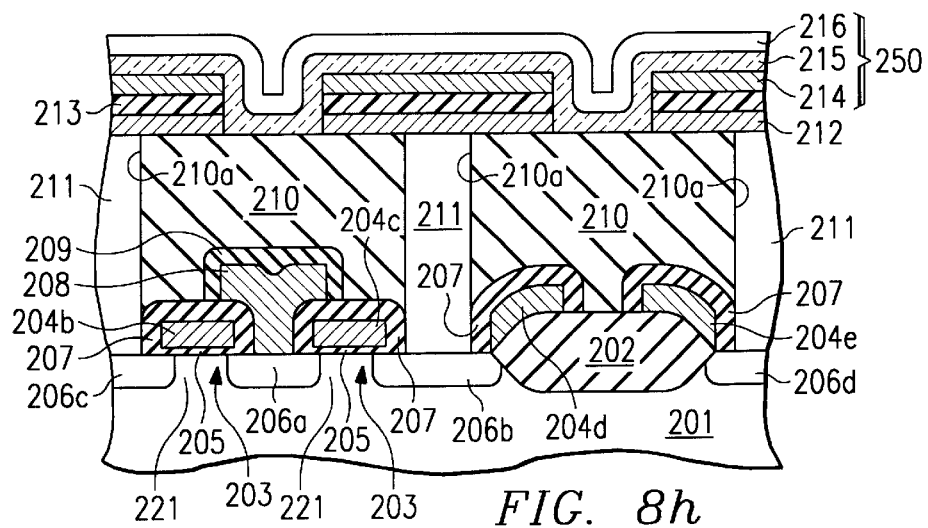

(10) Deposit a common top plate 216 of Ir on the BST layer; again the Ir deposition may be sputtering or MOCVD. Further conducting layers (e.g., IrO$_2$/Ir/TiN/Al may be added on top of the Ir and the structure may be annealed. FIG. 8h shows BST 215 and top Ir 216 to form capacitor 250 with bottom plate Ir 214.

Figure 8I:
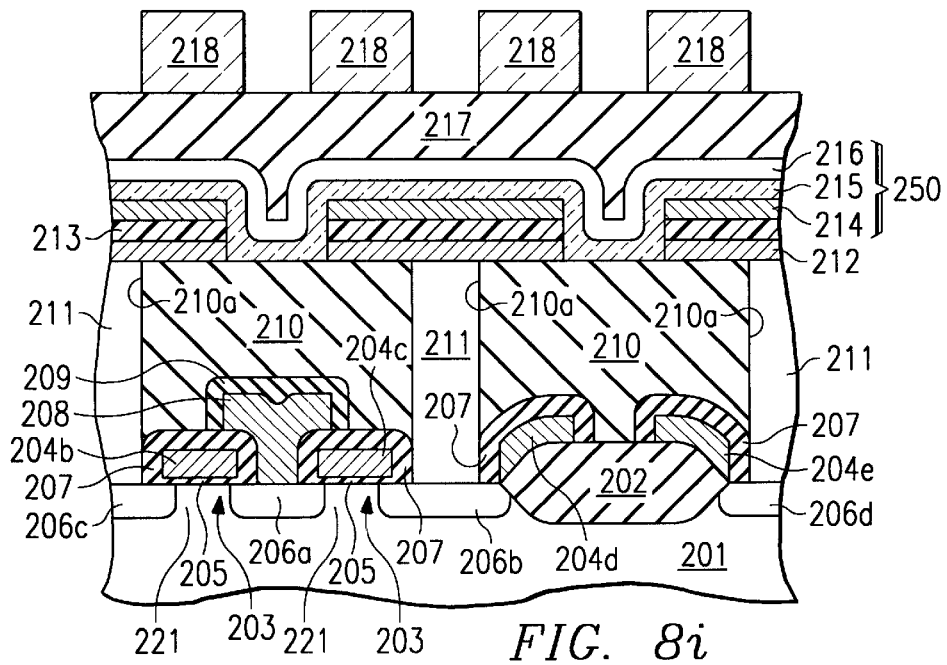

(11) Further insulating and interconnect layers are then applied with via etched for connections to underlying conductors. FIG. 8i illustrates overlying insulator layer 217 and metal wiring 218.

Ir and IrO$_2$

The second preferred embodiment BST capacitor (and associated DRAM) uses alternative Ir-based capacitor plates. In particular, the Ir monolayer on BST with the Ir atoms at the O sites of the BST surface and with adjacent layers of further Ir or O (that is, either Ir or IrO$_2$ or a mixture) will preserve the high Schottky barrier which provides the low leakage and high breakdown electric fields of the BST capacitor.

Figure 9A:
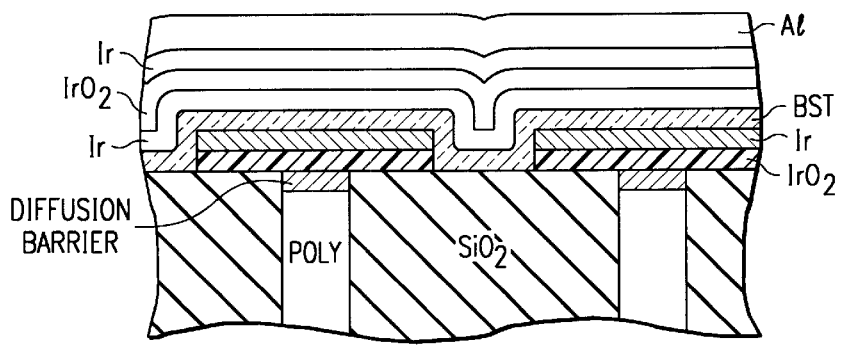
FIGS. 9a–d illustrate capacitor plate stacks.

Indeed, the bottom plate could be fabricated by depositing a stack of Ir and IrO$_2$ layers as illustrated in FIG. 9a which shows a stack of Ir/IrO$_2$ for the bottom capacitor plate on SiO$_2$ insulator and a stack of Ir/IrO$_x$/Ir/Al for the top plate. The IrO$_2$ provides good adhesion to SiO$_2$ and acts as a source of oxygen during BST deposition or anneals to limit oxygen vacancy generation in the BST and prevent oxygen diffusion to a silicon diffusion barrier (e.g., TiN) or polysilicon, (if the diffusion barrier is omitted) which can oxidize the TiN or polysilicon to form nonconductive oxides. (This would also prevent oxygen vacancy buildup at the interface and reduces fatigue and time dependent dielectric breakdown for a barium titanate ferroelectric nonvolatile capacitor.) The Ir and $IrO_2$ layers may be 50–100 nm thick each, although the Ir abutting the BST may be very thin (e.g., less than about 1 nm suffices) to put the oxide close to the BST. Such thin Ir layers with good surface coverage can be formed by low temperature sputtering. The Ir between the $IrO_2$ and the Al in the top plate prevents the Al at the interface from being oxidized to nonconductive $Al_2O_3$. However, Ir—Al intermetallics may form, but these will be conducting. A diffusion barrier such as TiN could be used between the Ir and Al to prevent reactions. The BST dielectric would be in the range of roughly 30–60 nm thick.

Figure 9B:
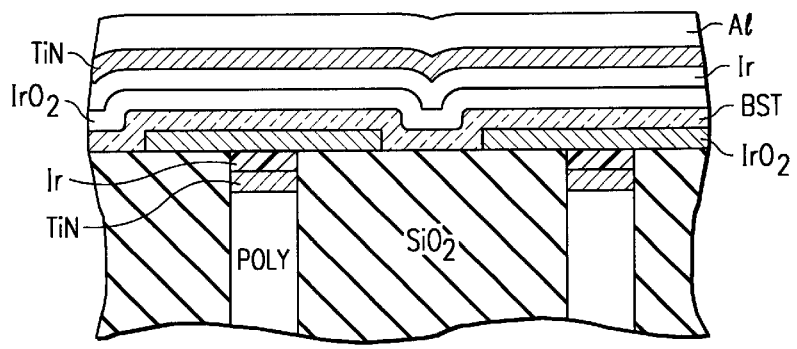

FIG. 9b shows an $IrO_2$ bottom capacitor plate and an $IrO_2$/Ir/TiN/Al top plate. The $IrO_2$/BST interface will still have the Ir atoms above the O sites of the BST surface and yield the high Schottky barriers but will also be simpler to fabricate in that fewer layers are needed. An Ir cap on a TiN silicon diffusion barrier will prevent oxidation of the Ti at the interface with $IrO_2$.

In all of the preferred embodiments the silicon diffusion barrier alternatively could be made of TiAlN, $W_2N$, TaN, and so forth intead of the example TiN.

Rh plus $RhO_2$

Further preferred embodiment BST capacitors (and associated DRAMs) use Rh-based capacitor plates analogous to the Ir-based capacitor plates of the preceding preferred embodiments. In particular, a substitution of Rh for Ir in the preferred embodiments should yield a similar Schottky barrier height. In fact, mixtures of Ir and Rh and their oxides should be comparable to the Ir, and $IrO_2$ preferred embodiments.

Thin Ir or Rh Plus Conductive Oxide

Figure 9C:
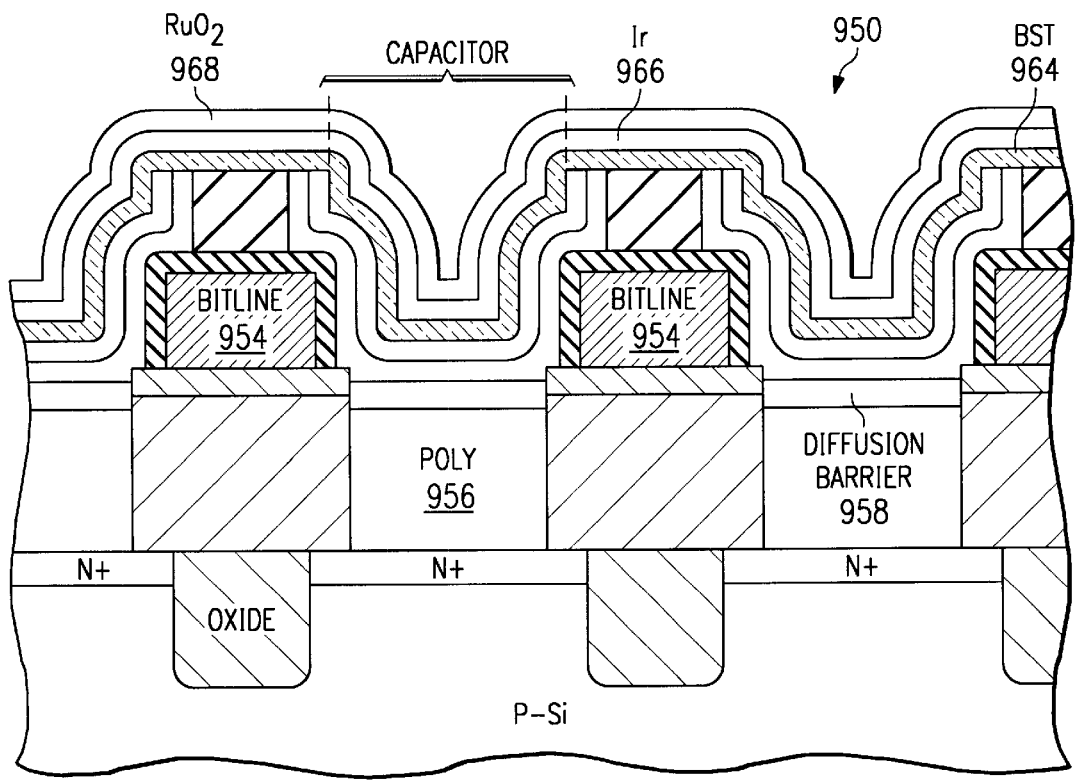
Figure 9D:
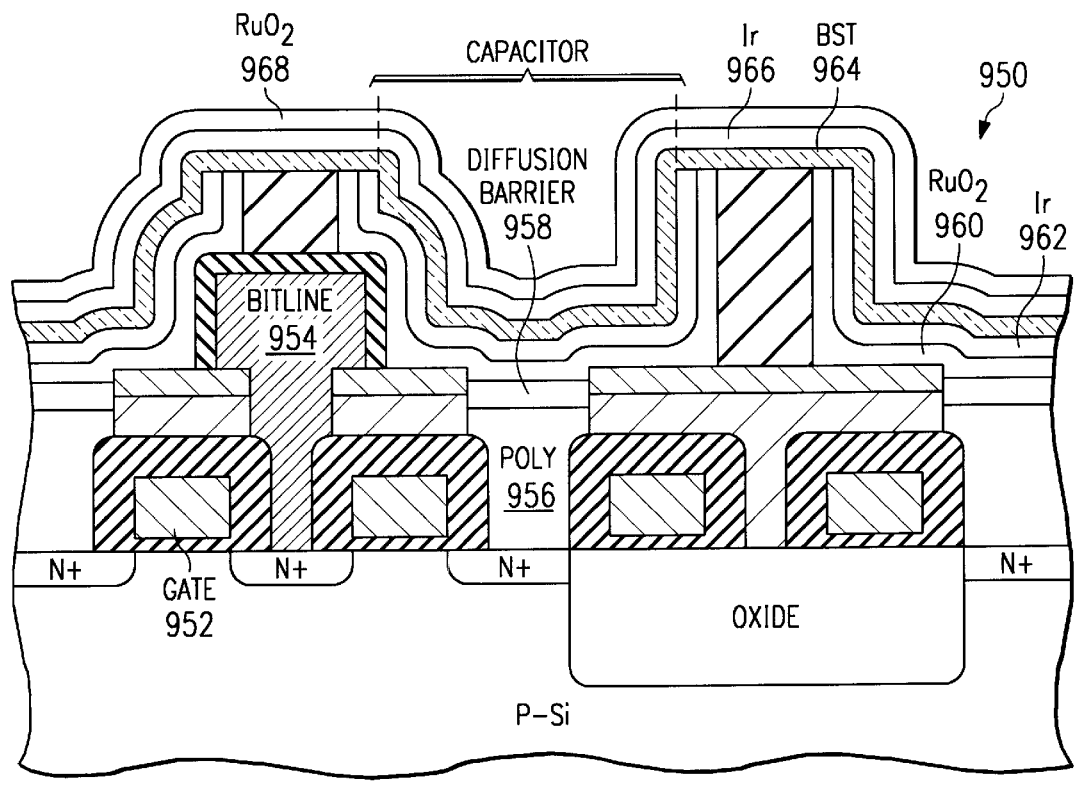

Another set of preferred embodiment BST capacitors (and associated DRAMs) use thin Ir or Rh contact layers on a BST dielectric plus a conductive oxide backing layer for each Ir or Rh layer. The conductive oxide provides an oxygen diffusion barrier, an oxygen source at high temperatures, and, especially for the bottom capacitor plate, adhesion to the underlying insulator. FIGS. 9c–d illustrate in cross sectional elevation views DRAM cell 950 with a "bathtub" capacitor and including a pass transistor (gate 952) between bitline connection 954 and polysilicon capacitor connection 956, diffusion barrier 958 (which may be a TiN layer abutting polysilicon 956 to prevent silicon diffusion plus a Ru layer to keep oxygen in overlying $RuO_2$ from reacting with the TiN to form nonconductive $TiO_2$), $RuO_2$ backing layer 960 of thickness about 200 nm, Ir (or Rh) bottom contact layer 962 of thickness about 4–5 nm, BST dielectric layer 964 of thickness about 30 nm, Ir (or Rh) top contact layer 966 of thickness about 4–5 nm, and $RuO_2$ top backing layer 968 of thickness 300 nm. As with the embodiments of FIGS. 9a–b, further metal layers (such as Ru/TiAlN/Al or simply Al) connect to top $RuO_2$ but are not shown for clarity in FIGS. 9c–d.

The Ir or Rh layers have an average thickness of about 4–5 nm but still provide essentially 100% surface coverage. Such thin layers can be formed by room temperature high rate sputtering or by CVD (metalorganic or plasma enhanced) at 150–400° C., although the minimal average thickness to insure 100% surface coverage is a sensitive function of process conditions and the surface material. Thus a target average thickness of 10 nm will provides a safety margin. Further, for nonplanar structures, such as in FIGS. 9c–d, CVD gives desired conformal deposition.

First principles analysis indicates a few monolayers of Ir or Rh are thick enough to preserve the Schottky barrier height of the Ir/BST or Rh/BST interface, so 1–2 nm thick Ir or Rh layers could be used. Such thin Ir or Rh layers could be formed by very low temperature (e.g., −200° C.) sputtering.

In experimental contrast, vapor phase growth of Pt thin films at 700° C. presents very poor conditions for surface coverage with minimal average thickness, but even then 20–25 nm thick films have provided 100% surface coverage on oxides under such conditions. During such film growth conditions, Pt first nucleates in small clusters and at an average film thickness of 1–2 nm the Pt is a, series of islands roughly 2–6 mm in diameter and covering somewhat less than 50% of an oxide surface. When the film thickness has increased to 10 nm the islands have grown (by coalescence) to roughly 20–100 nm diameters but still cover only about 50% of the surface, and new nucleation clusters form in spaces opened up by the coalescence. With a film thickness of roughly 20–25 nm the film has covered the surface except possibly for pinholes. This indicates that Ir and Rh can provide the same surface coverage with layers at least this thin because the melting points of Rh (2239 K) and Ir (2683 K) greatly exceed that of Pt (2045 K).

The thin Ir or Rh film capacitor structure maintains the Ir/BST or Rh/BST dc leakage current and limits the oxygen diffusion and adhesion problems with the $RuO_2$ backing layer. However, such thin Ir or Rh layers may possibly hillock to relieve thermal stress created during high temperature processing due to the thermal expansion coefficient of Ir or Rh exceeding that of $RuO_2$ and BST. In extreme cases, the thin film possibly may agglomerate. Consequently, a somewhat thicker Ir or Rh layer as previously noted (e.g., about 10 nm) may be used. Alternatively, the thermal stress could be reduced by deposition of the Ir or Rh at a moderate temperature and restriction of processing temperatures (such as the BST anneal) to as low as possible. Also, the bottom Ir or Rh layer suffers more processing steps, so the bottom Ir or Rh layer could be thicker than the top Ir or Rh layer.

The thin Ir or Rh plus conductive oxide backing layer may be used as a capacitor plate with other oxide dielectrics such as PZT, strontium bismuth tantalate (SBT), and so forth and provide the same advantage of a closeby oxygen barrier.

Asymmetrical Capacitor Plates

Additional preferred embodiments mix the capacitor plate materials of the preceding preferred embodiments such as one plate may be made of Ir and/or $IrO_2$ and the other plate may be thin Ir with a backing conductive oxide.

Figure 10A:
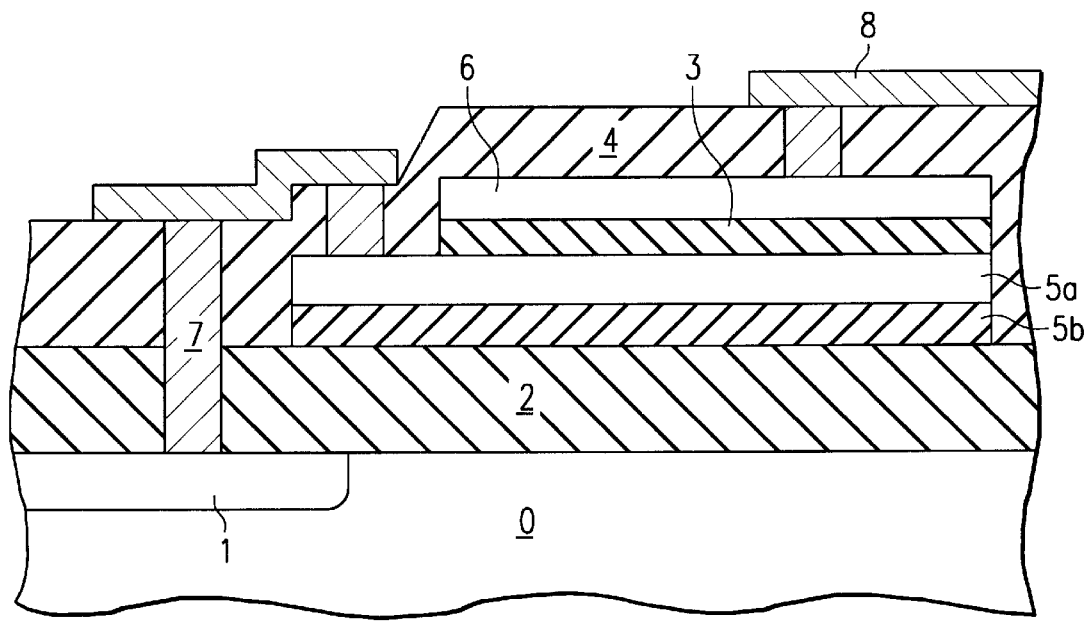
FIGS. 10a–b show alternative capacitor structures.
Figure 10B:
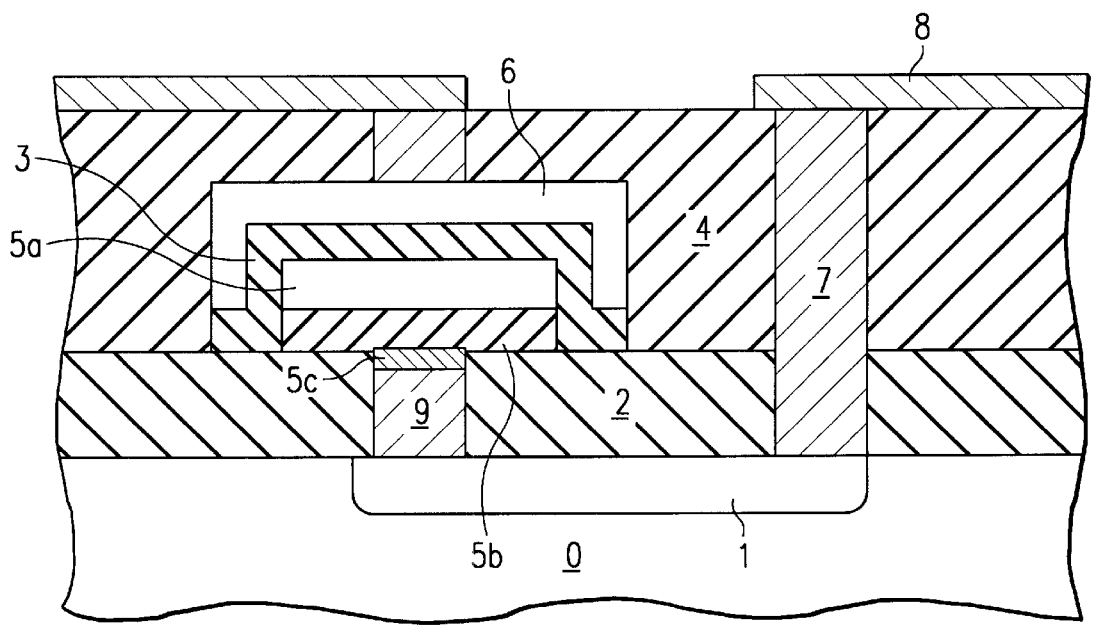

FIGS. 10a–b show such asymmetrical plates in alternative test capacitor structure. In particular, for both FIG. 10a and FIG. 10b item O is a silicon substrate with item 1a doped region (which typically would be a transistor source for a DRAM cell as in FIG. 1a), item 2 is a first level insulator such as $SiO_2$ or $Si_3N_4$, item 3 is BST or some other high dielectric constant oxide material, item 4 is a second level of insulator, again typically $SiO_2$ or $Si_3N_4$, item 5a is the part of the bottom plate abutting the BST and could be Ir or Rh or $IrO_2$ or $RhO_2$ or mixtures with item 5b an adhesion layer of $RuO_2$ or other conductive oxide (e.g., $IrO_2$, $ReO_2$, $OSO_4$, etc.) which will act as oxygen source and diffusion barrier for item 5a being Ir, item 5c (FIG. 10b only) is a diffusion barrier which could control any oxygen diffusion from BST along the interface of layer 5b and layer 2 and reacting with plus item 9 which may be polysilicon or a metal such as W or TiN, item 6 is the top plate and may be a single layer of Ir or Rh or a multilayer such as the bottom plate and provide an oxygen source and barrier, item 7 is a plug which may be polysilicon, W, TiN, Al and is formed after the BST, item 8 is a top metalliztion such as Al.

The BST may be 30–60 nm thick, the Ir or Rh may be 1–50 nm thick, the $IrO_2$ (or other conductive oxide) may be 50–200 nm thick, and the top plate may be Ir or Rh 100 nm thick or a stack of materials with thin Ir or Rh.

Modifications

The preferred embodiments may be varied in many ways while retaining one or more of the features of the high Schottky barrier of an Ir or Rh interfaces with BST and thin Ir or Rh backed by conductive oxide for dielectric oxides generally. For example, the capacitors may be used in various circuits other than DRAMs such as analog-to-digital converters, active filters, switched capacitor arrangements, and so forth. The lateral dimensions of the capacitors can be changed to meet device density demands.

What is claimed is:

1. A capacitor, comprising:
   (a) a dielectric layer including barium strontium titanate; and
   (b) a capacitor plate abutting said dielectric layer, said plate made of a material selected from the group consisting of iridium, iridium oxide, and mixtures thereof.

* * * * *

UNITED STATES PATENT AND TRADEMARK OFFICE
CERTIFICATE OF CORRECTION

PATENT NO. : 6,462,931 B1 Page 1 of 1
DATED : October 3, 2002
INVENTOR(S) : Shaoping Tang, John Mark Anthony and Scott Summerfelt It is certified that error appears in the above-identified patent and that said Letters Patent is hereby corrected as shown below:

<u>Title page,</u>
Item [60], insert
-- Related U.S. Application Data
[60]     Provisional Application No. 60/030,341 filed 11/05/96. --

Signed and Sealed this

Twenty-fifth Day of March, 2003

JAMES E. ROGAN
*Director of the United States Patent and Trademark Office*